(12) United States Patent
Jenninger et al.

(10) Patent No.: US 8,446,080 B2
(45) Date of Patent: May 21, 2013

(54) FERROELETRET MULTILAYER COMPOSITE AND METHOD FOR PRODUCING A FERROELECTRET MULTILAYER COMPOSITE WITH PARALLEL TUBULAR CHANNELS

(75) Inventors: Werner Jenninger, Cologne (DE); Joachim Wagner, Cologne (DE); Reimund Gerhard, Berlin (DE); Ruy Alberto Altafi, Nova Santa Paula (BR); Werner Wirges, Kleinmachnow (DE)

(73) Assignee: Bayer MaterialScience AG, Leverkusen (DE)

( * ) Notice: Subject to any disclaimer, the term of this patent is extended or adjusted under 35 U.S.C. 154(b) by 0 days.

(21) Appl. No.: 12/998,839

(22) PCT Filed: Nov. 28, 2009

(86) PCT No.: PCT/EP2009/008478
§ 371 (c)(1), (2), (4) Date: Jun. 8, 2011

(87) PCT Pub. No.: WO2010/066347
PCT Pub. Date: Jun. 17, 2010

(65) Prior Publication Data
US 2011/0234056 A1    Sep. 29, 2011

(30) Foreign Application Priority Data

Dec. 13, 2008  (EP) .................................... 08021693

(51) Int. Cl.
*H01L 41/16* (2006.01)
*H01L 41/00* (2006.01)

(52) U.S. Cl.
USPC .......................................................... 310/800

(58) Field of Classification Search
USPC .......................................................... 310/800
See application file for complete search history.

(56) References Cited

U.S. PATENT DOCUMENTS

| | | | |
|---|---|---|---|
| 4,654,546 A * | 3/1987 | Kirjavainen | 307/400 |
| 5,548,564 A * | 8/1996 | Smith | 367/140 |
| 6,729,807 B1 * | 5/2004 | Spittle | 405/302.7 |
| 6,759,769 B2 * | 7/2004 | Kirjavainen | 307/400 |

(Continued)

FOREIGN PATENT DOCUMENTS

WO    2006053528 A1    5/2006

OTHER PUBLICATIONS

M. Wegener et al, Voided Cyclo-olefin Polymer Films: Ferroelectrets with High Thermal Stability, Proceedings, 12th International Symposium on Electrets, (IEEE Service Center, Piscataway, New Jersey, USA 2005), pp. 47-50 (2005).

(Continued)

*Primary Examiner* — Thomas Dougherty
(74) *Attorney, Agent, or Firm* — John E. Mrozinski, Jr.

(57) ABSTRACT

The present invention relates to a ferroelectret multi-layer composite (1) comprising at least two polymer films arranged one on top of the other and bonded together, wherein voids are formed between the polymer films, said voids being tubular channels, particularly running parallel to one another. The invention further provides a process for the production of a ferroelectret multi-layer composite with parallel tubular channels, and a device for carrying out the process for the production of the ferroelectret multi-layer composite according to the invention. In addition, the invention relates to a piezoelectric element containing a ferroelectret multi-layer composite according to the invention.

9 Claims, 5 Drawing Sheets

U.S. PATENT DOCUMENTS

| | | | | |
|---|---|---|---|---|
| 7,303,642 | B2* | 12/2007 | Topolkaraev | 156/229 |
| 7,518,284 | B2* | 4/2009 | Benslimane et al. | 310/311 |
| 7,843,111 | B2* | 11/2010 | Benslimane et al. | 310/311 |
| 7,880,371 | B2* | 2/2011 | Benslimane et al. | 310/367 |
| 2004/0091677 | A1* | 5/2004 | Topolkaraev | 428/184 |
| 2010/0047657 | A1* | 2/2010 | MacKinnon et al. | 429/33 |

OTHER PUBLICATIONS

Etta Saarimäki et al, Novel Heat Durable Electromechanical Film: Processing for Electromechanical and Electret Applications, IEEE Transactions on Dielectrics and Electrical Insulation, vol. 13, pp. 963-972, Oct. 2006.

Werner Wirges et al, Optimized Preparation of Elastically Soft, Highly Piezolectric, Cellular Ferroelectrets from nonvoided Poly-(ethylene terephthalate) Films. Advanced Functional Materials 17, pp. 324-329 (2007).

P. Fang et al, Cellular Polyethylene-naphthalate Ferroelectrets: Foaming in Supercritical Carbon Dioxide, Structural and Electrical Preparation, and Resulting Piezoelectricity, Applied Physics Letters 90, 192908 (2007).

O. Voronina et al, Physical Foaming of Fluorinated Ethylene-propylene (FEP) Copolymers in Supercritical Carbon Dioxide: Single Film Fluoropolymer Piezoelectrets, Applied Physics A: Materials Science & Processing 90, pp. 615-618 (2008).

R. Kacprzyk et al. Double-Layer Electret Transducer, Journal of Electrostatics, vol. 39, pp. 33-40, 1997.

Z. Hu et al, Air-breakdown Charging Mechanism of Fibrous Polytetrafluoroethylene Films, Journal of Applied Physics, vol. 98, Paper 014108, 2005.

Z. Hu et al, Breakdown-Induced Polarization Buildup in Porous Fluoropolymer Sandwiches: A Thermally Stable Piezoelectret, Journal of Applied Physics, vol. 99, Paper 024102, 2006.

Basso, H.C. et al, Three-Layer Ferroelectrets from Perforated Teflon-PTFE Films Fused Between Two Homogeneous Teflon-FEP Films, IEEE, 2007 Annual Report Conference on Electrical Insulation and Dielectric Phenomena, 1-4244-1482-2/07, pp. 453-456, 2007.

Jinfeng Huang et al, Piezoelectrets from Laminated Sandwiches of Porous Polytetrafluoroethylene Films and Nonporous Fluoroethylenepropylene Films, Journal of Applied Physics, vol. 103, Paper 084111, 2008.

X. Zhang et al, Thermally Stable Fluorocarbon Ferroelectrets with High Piezoelectric Coefficient, Applied Physics A., vol. 84, pp. 139-142, 2006.

X. Zhang et al, Ferroelectrets with Improved Thermal Stability Made from Fused Fluorocarbon Layers, Journal of Applied Physics, vol. 101, paper 054114, 2007.

Xiaoqing Zhang et al, Piezoelectric Activity and Thermal Stability of Cellular Fluorocarbon Films, Physica Scripta, vol. T129, pp. 274-277, 2007.

R.A.C. Altafim et al, Piezoelectrets from Thermo-formed Bubble Structures of Fluoropolymer-Electret Films, IEEE Transactions on Dielectrics and Electrical Insulation, vol. 13, No. 5, pp. 979-985, 2006.

* cited by examiner

FERROELETRET MULTILAYER COMPOSITE AND METHOD FOR PRODUCING A FERROELECTRET MULTILAYER COMPOSITE WITH PARALLEL TUBULAR CHANNELS

The present invention relates to a ferroelectret multi-layer composite and a process for the production of a ferroelectret multi-layer composite with tubular channels, particularly tubular channels running parallel to one another.

Owing to their advantageous properties which can be specifically adjusted, such as e.g. low weight, thermal conductivity, mechanical deformability, electrical properties and barrier properties, polymers and polymer composite materials are used in a large number of commercial applications. For example, they are used as packaging material for foodstuffs or other goods and as construction or insulation materials, e.g. in the building sector or in vehicle construction. However, functional polymers are increasingly gaining importance as active components in sensor or actuator applications. One important application concept in this respect relates to the use of polymers as electromechanical or piezoelectric transducers. Piezoelectric materials are able to transform a mechanical pressure into an electrical voltage signal in a linear fashion. Conversely, an electrical field applied to the piezoelectric material can be transformed into a change in the transducer geometry. Piezoelectric polymers are already integrated as active components in a large number of applications. These include, for example, textured pressure sensors for keyboards or touchpads, acceleration sensors, microphones, loudspeakers, ultrasonic transducers for applications in medical technology, marine technology or for materials testing. In WO 2006/053528 A1, for example, an electroacoustic transducer based on a piezoelectric element made of polymer films is described.

Over the last few years, there has been increasing research interest in a new class of piezoelectric polymers, the so-called ferroelectrets. The ferroelectrets are also known as piezoelectrets. Ferroelectrets consist of polymer materials which can store electrical charges over long periods and additionally exhibit a void structure. The ferroelectrets known up to the present exhibit a cellular void structure and are constructed in the form of either expanded polymer films or multi-layer systems made of polymer films or polymer fabrics. If electrical charges are distributed on the different surfaces of the voids according to their polarity, each charged void represents an electric dipole. If the voids are now deformed, this causes a change in the dipole value and leads to a flow of current between external electrodes. The ferroelectrets can display piezoelectric activity which is comparable to that of other piezoelectrics.

In U.S. Pat. No. 4,654,546, a process for the production of expanded polypropylene films as a precursor to a ferroelectret film is described. In this process, filler particles are added to the polymer films. Titanium dioxide, for example, is used as the filler. After extrusion, the polypropylene films are biaxially oriented so that small voids form in the film around the filler particles. This process has also been applied to other polymers in the meantime. Thus, for example, in M. Wegener, M. Paajanen, O. Voronina, R. Schulze, W. Wirges and R. Gerhard-Multhaupt "Voided cyclo-olefin polymer films: Ferroelectrets with high thermal stability", Proceedings, 12th International Symposium on Electrets (IEEE Service Center, Piscataway, N.J., USA 2005), 47-50 (2005) and Eetta Saarimäki, Mika Paajanen, Ann-Mari Savijärvi, and Hannu Minkkinen, Michael Wegener, Olena Voronina, Robert Schulze, Werner Wirges and Reimund Gerhard-Multhaupt "Novel Heat Durable Electromechanical Film: Processing for Electromechanical and Electret Applications", IEEE Transactions on Dielectrics and Electrical Insulation 13, 963-972 (October 2006), the production of ferroelectret films from cyclo-olefin copolymers (COC) and cyclo-olefin polymers (COP) is described. The expanded polymer films have the disadvantage that a broad distribution of the bubble size can occur. As a result, the bubbles may not all be charged equally well in the subsequent charging step. In addition, when expanded polymer films are being produced in a continuous roll-to-roll process, a further process step generally has to be added to optimise the bubble size, which is not itself accessible to a roll-to-roll process.

Another process for the production of expanded ferroelectret polymer films is the direct physical foaming of a homogeneous film with supercritical fluids, e.g. with carbon dioxide. In Advanced Functional Materials 17, 324-329 (2007), Werner Wirges, Michael Wegener, Olena Voronina, Larissa Zirkel and Reimund Gerhard-Multhaupt "Optimized preparation of elastically soft, highly piezoelectric, cellular ferroelectrets from nonvoided poly(ethylene terephthalate) films", and in Applied Physics Letters 90, 192908 (2007), P. Fang, M. Wegener, W. Wirges and R. Gerhard L. Zirkel "Cellular polyethylene-naphthalate ferroelectrets: Foaming in supercritical carbon dioxide, structural and electrical preparation, and resulting piezoelectricity", this process was described with polyester materials, and in Applied Physics A: Materials Science & Processing 90, 615-618 (2008), O. Voronina, M. Wegener, W. Wirges, R. Gerhard, L. Zirkel and H. Münstedt "Physical foaming of fluorinated ethylene-propylene (FEP) copolymers in supercritical carbon dioxide: single film fluoropolymer piezoelectrets" it was described for a fluoropolymer FEP (fluorinated ethylene-propylene copolymer). Up to the present, the foaming process with supercritical carbon dioxide has also been impossible to carry out in a roll-to-roll process, which represents a significant disadvantage of the process for industrial application.

In the ferroelectret multi-layer systems, among other things arrangements of rigid and flexible layers with charges introduced between them are known. In "Double-layer electret transducer", Journal of Electrostatics, vol. 39, pp. 33-40, 1997, R. Kacprzyk, A. Dobrucki and J. B. Gajewski, multiple layers of solid material with markedly differing moduli of elasticity are described. These have the disadvantage that these laminar systems display only a relatively small piezoelectric effect.

Latest developments in the field of ferroelectrets provide textured polymer layers. Several publications over the last few years have described multi-layer systems comprising closed outer layers and a porous or perforated middle layer. These include the articles by Z. Hu and H. von Seggern, "Air-breakdown charging mechanism of fibrous polytetrafluoroethylene films", Journal of Applied Physics, vol. 98, paper 014108, 2005 and "Breakdown-induced polarization buildup in porous fluoropolymer sandwiches: A thermally stable piezoelectret", Journal of Applied Physics, Vol. 99, paper 024102, 2006, and the publication by H. C. Basso, R. A. P. Altafilm, R. A. C. Altafilm, A. Mellinger, Peng Fang, W. Wirges and R. Gerhard "Three-layer ferroelectrets from perforated Teflon-PTFE films fused between two homogeneous Teflon-FEP films" IEEE, 2007 Annual Report Conference on Electrical Insulation and Dielectric Phenomena, 1-4244-1482-2/07, 453-456 (2007) and the article by Jinfeng Huang, Xiaoqing Zhang, Zhongfu Xia and Xuewen Wang "Piezoelectrets from laminated sandwiches of porous polytetrafluoroethylene films and nonporous fluoroethylenepropylene films" Journal of Applied Physics, Vol. 103, paper 084111, 2008. The laminar systems with a porous or perforated middle layer have greater piezoelectric constants compared with the systems described above. However, sometimes the middle layers cannot be reliably laminated with the solid outer layers. Moreover, the perforation of the middle layer is generally very time-consuming.

In the publications by X. Zhang, J. Hillenbrand and G. M. Sessler, "Thermally stable fluorocarbon ferroelectrets with high piezoelectric coefficient", Applied Physics A, vol. 84, pp. 139-142, 2006 and "Ferroelectrets with improved thermal stability made from fused fluorocarbon layers", Journal of Applied Physics, vol. 101, paper 054114, 2007, and in Xiaoqing Zhang, Jinfeng Huang and Zhongfu Xia "Piezoelectric activity and thermal stability of cellular fluorocarbon films" PHYSICA SCRIPTA vol. T129 pp. 274-277, 2007, the texturing of the polymer layers by pressing a metal lattice onto a stack of polymer layers consisting of at least three FEP and PTFE layers stacked one on top of the other in an alternating sequence is described. By pressing the layers together through the lattice at a temperature above the melting point of FEP and below that of PTFE, the polymer layers are bonded together to correspond to the lattice structure in such a way that, between the bars of the lattice, dome-shaped or bubble-shaped voids are formed with a rectangular base. However, this process leads to ferroelectrets with variable quality, since the formation of uniform voids is difficult to control, particularly as the number of layers increases.

Another process for the production of bubble-shaped voids using a lattice has been described by R. A. C. Altafim, H. C. Basso, R. A. P. Altafim, L. Lima, C. V. De Aquino, L. Gonalves Neto and R. Gerhard-Multhaupt in "Piezoelectrets from thermo-formed bubble structures of fluoropolymer-electret films", IEEE Transactions on Dielectrics and Electrical Insulation, vol. 13, No. 5, pp. 979-985, 2006. In this process, two Teflon-FEP films arranged one on top of the other are arranged between a metal lattice and an upper cylindrical metal part. This construction is pressed with the metal lattice on to a lower cylindrical metal part which has openings for the application of a vacuum. The FEP films are heated through the upper metal part and, by means of a vacuum applied to the lower metal part, the lower film is drawn into the openings of the lattice and corresponding voids are formed. The processes described, which use a lattice to form voids in the multi-layer polymer composites, are costly and difficult to convert to a large scale.

Ferroelectrets continue to be of increasing interest for commercial applications, e.g. for sensor and actuator systems. In order to be economical, it is essential that they can be manufactured in an industrial-scale process.

The invention is therefore based on the object of providing an alternative ferroelectret multi-layer composite and an alternative process for the production of a ferroelectret multi-layer composite with which a defined ferroelectret void structure can be produced and which can be implemented simply and cheaply even on a large and an industrial scale.

This object is achieved according to the invention by a ferroelectret multi-layer composite according to claim 1 and a process for the production of a ferroelectret multi-layer composite with parallel tubular channels according to claim 7.

According to the invention, a ferroelectret multi-layer composite is provided, which comprises at least two polymer films arranged one on top of the other and bonded together, wherein voids are formed between the polymer films and the voids are in the form of tubular channels. The tubular channels particularly preferably run parallel to one another.

In other words, the multi-layer composites according to the invention exhibit stacked layers of polymer films and, between every two polymer films, elongated channels, particularly preferably running in parallel lines, as voids. The polymer films are bonded together between the channels and, in each of the non-bonded areas, form the walls of the tubular channels. Within the range of manufacturing tolerances, deviations of up to 10% are also possible in the parallel orientation here, inter alia. The parallel channels that are formed between two identical layers of polymer films according to the invention are also referred to according to the invention as a ply of channels.

In preferred embodiments of the invention, the channels can be open at their ends or can be closed at one or both ends. The channels can also be designed such that adjacent channels are open and closed, e.g. at periodic or even irregular intervals.

The closed channels have the advantage that these are hermetically sealed from the environment. They can therefore be used with sealed, i.e. closed, channels even in applications in an aggressive environment, e.g. in atmospheres with high humidity or under water.

In another preferred embodiment of the invention, the closed channels can be filled with a gas. This gas can be, for example, pure nitrogen ($N_2$), nitrogen oxide ($N_2O$) or sulfur hexafluoride ($SF_6$). As a result of filling with gas, significantly higher piezoelectric constants can again advantageously be achieved in the ferroelectret multi-layer composite according to the invention.

In principle, the polymer films in this case can be made from any plastic that permits a bond between the polymer films and a formation of channels between the films. In a preferred embodiment according to the invention, the polymer films can consist of identical or different polymer materials selected from the group of the polycarbonates, perfluorinated or partially fluorinated polymers and copolymers, polyesters, cyclo-olefin polymers, cyclo-olefin copolymers, polyimides, polymethyl methacrylate and polypropylene or polymer blends. It is possible to achieve good to very good piezoelectric activities with these materials. Advantageously, the broad choice of materials according to the invention can also make it possible to adapt to specific applications.

The polymer films can preferably have a thickness of $\geq 10$ µm to $\leq 200$ µm. The thickness of the various polymer films in a ferroelectret multi-layer composite according to the invention can be selected here to be the same or different. A particularly suitable thickness of the polymer films can advantageously be selected as a function of the polymer material and with a view to the desired application. The important thing is that the tubular channels do not collapse as voids. Thus, more rigid materials can be of thinner construction than comparatively more elastic polymer materials.

The polymer films can be designed as film sheets or, particularly with a view to large-scale manufacture, advantageously also as film webs, which can be arranged one on top of the other and bonded together to form the tubular channels. The film sheets in this case can, for example, have a rectangular or a regular or irregular polygonal shape or a round, e.g. circular, elliptical or oval, base, the films arranged one on top of the other usefully having the same base, at least in the area where they are arranged one on top of the other. In principle, the base can also be adapted to a specific application.

In one preferred embodiment of the ferroelectret multi-layer composite according to the invention, three or more polymer films can be arranged one on top of the other and bonded together, in which case the channels that preferably run parallel to one another between the polymer films can be arranged parallel or perpendicular to one another in plies arranged one on top of the other. In other words, in an imaginary top view of such a multi-layer composite, a lattice-like arrangement of the parallel channels arranged in consecutive plies can also be obtained. According to the invention, the channels in a lattice arrangement can be arranged not only at a right angle to one another but other angles to one another can also be arranged and are included according to the invention. If the channels are oriented parallel to one another in the consecutive plies, they can be arranged directly on top of one another or offset in relation to one another. In the case of a parallel orientation of the channels in the consecutive plies, an offset arrangement is preferable since this enables the piezoelectric effect to be more uniform and the surface texturing of the ferroelectret multi-layer composite to be minimised. Advantageously, with these variants of the invention in which three or more polymer films and correspondingly multiple plies of tubular channels can be provided in the ferroelectret multi-layer composite, can be designed to be more flexible compared with those having only two polymer films and the sensitivity of the composite and thus the d33 piezoelectric constant can be increased as a result of the additional voids that are present.

In one preferred embodiment of the ferroelectret multi-layer composite according to the invention, the channels can have a height of $\geq 10$ μm to $\leq 500$ μm. The height refers particularly to the maximum height of the tubular channels in cross section. The height can remain the same across the width of the channels, for example, as in the case of a substantially rectangular arrangement of the channels, or can increase from the sides towards the middle. Particularly preferably, the channels can have a height of $\geq 25$ μm to $\leq 250$ μm and most particularly preferably of $\geq 50$ μm to $\leq 150$ μm.

The tubular channels can have the same or different dimensions. For example, it is possible according to the invention to provide alternate broad and narrow channels. Such an arrangement of the channels can be employed advantageously for example in an application in which the composite is intended to be bent, for example guided or laid into a cylindrical shape and used. It is also possible to provide partial areas each having narrow and/or broad channels in a ferroelectret multi-layer composite prepared according to the invention. This enables the sensitivity to be adjusted accordingly in specific areas. One example of an application in which this can be utilised advantageously is the adjustment of pressure sensitivity in specific areas on a touchpad.

In different embodiments, the channels can have a substantially rectangular or a substantially round cross section. A substantially round cross section is intended to mean circular, elliptical or oval shapes. However, lens- or almond-like shapes are also possible. The aforementioned cross section shapes are advantageously easy to produce. In principle, however, other regular and irregular cross section shapes of the channels are also possible according to the invention.

In one preferred embodiment, the ferroelectret multi-layer composite according to the invention can have at least a partial conductive coating on the outward-facing surfaces of the polymer films. These conductive areas can be utilised as electrodes. The conductive coating, i.e. the electrodes, can be applied flat and/or can be textured. A textured conductive coating can take the form of being applied in strips or as a lattice, for example. As a result, it is additionally possible to influence the sensitivity of the ferroelectret multi-layer composite and to adapt it to specific applications. This variant can, for example, be used advantageously if no further increase in piezoelectric effect can be achieved by increasing the number of layers of polymer films with tubular channels.

It is also included in the invention for two or more ferroelectret multi-layer composites with a conductive layer, i.e. electrode, of the same polarity to be bonded together. In other words, an intermediate electrode can be formed between two ferroelectret multi-layer composites according to the invention, which can be connected against the two electrodes on the outer surfaces. As a result, the ferroelectret multi-layer composites can be connected in series and the piezoelectric effect can be doubled or multiplied.

The invention also relates to a process for the production of a ferroelectret multi-layer composite with parallel tubular channels. In the process according to the invention, it is provided to carry out the following steps:
  a) provision of a stack of layers containing a first polymer film, a second polymer film and a mask layer arranged therebetween, the mask having one or more ridges within the stack of layers, spaced apart from one another by grooves, particularly parallel ridges, the ridges not being bonded, or being bonded in a separable fashion, at least one end and the mask protruding from the stack of layers at one or both ends,
  b) lamination of the stack of layers produced in step a) and bonding of the polymer films to form a polymer film composite,
  c) optional separation of the ridges of the mask at one end,
  d) removal of the mask from the polymer film composite by pulling the mask out of the polymer film composite,
  e) electrical charging of the internal surfaces of the tubular channels opened up in step d) with opposite electrical charges.

Using the process according to the invention, ferroelectret multi-layer systems with defined parallel tubular channels can be produced in a simple manner. By using the mask, the structure and shape of the tubes can be controlled very simply and precisely. It is therefore possible according to the invention to produce uniform channels. Different frequencies of resonance, as occur in expanded ferroelectret films as a result of non-uniform bubbles, can thus be avoided. Using the procedure according to the invention, it is additionally possible to adapt the frequency of resonance and piezoelectric activity, and particularly the piezoelectric d33 constant, to the particular application. Advantageously, it is possible to achieve high and uniform piezoelectric coefficients even for relatively large areas with the ferroelectret multi-layer composite systems produced according to the invention. This opens up these ferroelectret multi-layer composite products for numerous other uses. An additional advantage is that the process proposed according to the invention is largely independent of the material. The polymer films can, in principle, be made of any polymer material capable of being laminated. Examples of these are polycarbonate, perfluorinated or partially fluorinated polymers such as PTFE, fluoroethylenepropylene (FEP), perfluoroalkoxyethylenes (PFA), polypropylene, polyesters, such as polyethylene terephthalate (PET) or polyethylene naphthalate (PEN), cyclo-olefin polymers, cyclo-olefin copolymers, polyimides, polymethyl methacrylate (PMMA) or polymer blends.

The mask is usefully made and selected from a material that is not bonded to the polymer film material(s) under the operating conditions selected in each case.

In the simplest embodiment of the process, the mask can be a polymer film sheet, for example made of polytetrafluoroethylene (PTFE), in which parallel, elongated, rectangular grooves are cut or stamped so that the ridges are formed as parallel film strips which are joined together at both ends of the polymer film of the mask. This has the advantage that the ridges are fixed at both ends and do not slip or become deformed during manual handling and while carrying out the process. The mask can then be inserted between two polymer film sheets, e.g. of fluoroethylenepropylene (FEP), arranged one on top of the other, the ends of the mask protruding from the stack of layers that is formed. The stack of layers can then be laminated at a suitable elevated temperature. During this operation, the FEP polymer films bond together in the grooves of the mask and outline the shape of the ridges. At one end, the ridges can then be separated from one another in such a way that the mask takes on a comb-like shape and can be readily removed from the polymer film composite by pulling on the other end of the mask, where the ridges are still joined. A polymer film composite is obtained consisting of two polymer films with parallel tubular channels which extend from one side of the polymer film composite to the opposite side.

According to the invention, the removal of the mask in step d) can take place either by pulling on and moving the mask itself or by pulling on the polymer composite. It is also possible in step d) to open up the channels by simultaneously moving the polymer composite and pulling on the mask.

The width and height of the channels is defined according to the invention by the width and height of the ridges of the mask. This also applies to the cross sectional geometry of the channels, which is determined by the cross-sectional form of the ridges. The width of the grooves in the mask corresponds to the spacing of the channels in the resulting polymer film composite.

In preferred variants of the process according to the invention, before and/or after the electrical charging of the surfaces of the channels in step e), electrodes can be applied to the outer surfaces of the polymer composite. The application of electrodes to the outer surfaces is intended to mean the preparation of a conductive surface coating in at least a partial area on the outward-facing surfaces of the polymer composite. The electrode materials selected can be conductive materials known to the person skilled in the art. According to the invention, for example metals, metal alloys, conductive oligomers or polymers, such as e.g. polythiophenes, polyanilines, polypyrroles, conductive oxides, such as e.g. mixed oxides such as ITO, or polymers filled with conductive fillers are suitable for this purpose. Suitable fillers for polymers filled with conductive fillers are e.g. metals, conductive carbon-based materials, such as e.g. carbon black, carbon nanotubes (carbonanotubes (CNTs)), or again conductive oligomers or polymers. The filler content of the polymers in this case is above the percolation threshold, so the conductive fillers form continuous electrically conductive paths.

The electrodes can be formed by processes that are known per se, e.g. by metallising the surfaces, by sputtering, vacuum deposition, chemical vapour deposition (CVD), printing, knife application, spin coating, adhesive bonding or pressing on a conductive layer in ready-made form or by means of a spray electrode made of a conductive plastic. The electrodes can be textured in this case, e.g. designed in strips or in a lattice shape.

The ferroelectret multi-layer composites according to the invention preferably contain two electrodes. Electromechanical transducers according to the invention having more than two electrodes can be for example stacked structures of multiple ferroelectret multi-layer composites.

For the electrical charging and polarisation of the internal surfaces of the channels, it is advantageous to have recourse to known and established methods. Thus, after applying electrodes to the outer surfaces of the ferroelectret multi-layer composite, direct charging can take place by applying an electrical voltage. Before applying electrodes, the opposite sides of the voids, i.e. the channels, can be polarised e.g. by means of a corona discharge. A corona treatment can advantageously also be used very well on a large scale. According to the invention, it is also possible first to provide a conductive surface coating on one surface, and then to charge the polymer composite and finally to apply a second electrode to the opposite outer surface.

One advantageous embodiment of the invention provides that, in step a), the stack of layers contains one or more additional polymer films and one or more mask layers, the outer surface layers of the stack of layers always being formed by polymer films. Advantageously, the formation of uniform channels can take place according to the invention even with a relatively large number of polymer films and mask layers.

Another preferred embodiment provides that, in this case, the additional polymer film layers and mask layers are arranged in an alternating sequence in the stack of layers. In this way, it is advantageously possible to provide a ferroelectret multi-layer composite which can display an even greater piezoelectric effect (d33) as a result of the greater number of layers with multiple plies of parallel tubular channels.

The channels in the different consecutive plies in this case can be arranged parallel or perpendicular to one another. In an advantageous development of the process, therefore, the ridges in the masks can be oriented parallel or perpendicular to one another in consecutive plies. According to the invention, the channels can be arranged in a lattice arrangement not only at a right angle to one another but arrangements at other angles to one another are also possible. It is therefore also included in the invention that the ridges are arranged not only at a right angle to one another but also arrangements at other angles to one another are possible. In a top view, the consecutive mask layers in this variant give a fence or lattice shape. If the ridges of the masks are arranged parallel to one another in consecutive plies or mask layers, they can also be arranged in an offset position to one another or directly on top of one another. For special applications, the lattice arrangement may be advantageous. In the case of a simultaneous offset arrangement of parallel channels, an additional ply in a cross arrangement may be advantageous for the uniformity of the surface.

According to another preferred embodiment of the process according to the invention, in step b) the lamination can be carried out thermally or by means of ultrasound. This advantageously allows the choice of material for the polymer films to be increased still further.

In another preferred embodiment, the polymer films can be joined together by adhesive bonding as well as by lamination. This adhesive bond can be produced e.g. using acrylate adhesive. This enables the mechanical bonding of the polymer films to be supported and improved.

In one preferred embodiment, the ridges in the mask are not joined at one end and the steps a), b) and d) can be performed in a continuous roll-to-roll process. This is particularly advantageous for the application of the process on a large and an industrial scale. The automation of at least part of the production process simplifies the process again and makes possible the inexpensive production of a ferroelectret multi-layer composite with parallel tubular channels. In principle, it is advantageously possible according to the invention to perform all of the steps of the process, a) to e), continuously and/or automatically, e.g. as a roll-to-roll process.

The invention also relates to a piezoelectric element containing a ferroelectret multi-layer composite according to the invention. This can particularly preferably be a sensor or actuator element. The invention can advantageously be implemented in a wide variety of applications. Typical examples of these are pressure sensors, electroacoustic transducers, microphones, loudspeakers and "intelligent" floors.

In addition, a device for the production of a ferroelectret multi-layer composite according to the invention is proposed with the invention, comprising means of forming tubular channels, particularly tubular channels running parallel to one another.

It is preferred in this case that the means of forming parallel tubular channels comprise a mask, said mask having two or more ridges spaced apart from one another by grooves, particularly parallel ridges, the ridges not being joined, or being joined in a separable fashion, at least one end.

According to the invention, the mask is usefully made of a material that does not bond to the polymer film material under the operating conditions selected in each case. According to the invention, the mask can preferably be made of a polymer material, a metallic material and/or a composite material. A composite material also includes, according to the invention, the possibility of the polymer material or the metallic material of the mask being provided with a non-stick coating which facilitates the removal of the mask from the polymer film composite. If the mask is at least partly made of a metallic and magnetic material, the ridges can, in another advantageous embodiment, be held in position and in shape by a suitable arrangement of magnets or magnetic components in the device according to the invention. This enables the service life of the device to be prolonged and the quality of the ferroelectret polymer composites produced to be improved and guaranteed and maintained over a prolonged period.

The invention also relates to a device for carrying out a process, which contains at least the following components:
a) a laminating unit,
b) a mask with two or more parallel ridges spaced apart from one another by grooves, wherein the ridges are arranged at least partly inside the laminating unit,
c) in each case one or more feed devices for the continuous feed of at least one polymer film above and at least one polymer film below the mask to form a stack of layers, and wherein, in addition,
d) the ridges of the mask are joined together at the end that faces the feed devices and are separated from one another at the opposite end.

It is advantageously possible to carry out the process with the device at least partly as a continuous process, even on a large scale, preferably as a roll-to-roll process. This is particularly advantageous for the application of the process on an industrial scale. The automation of at least part of the production process simplifies the process again and makes possible the inexpensive production of a ferroelectret multi-layer composite with parallel tubular channels.

In one advantageous development, the laminating unit can have one or more textured laminating rolls. The texturing can advantageously be fashioned such that a higher pressure can be exerted on the areas of the polymer films to be bonded, thus improving the bonding of the polymer films. Alternatively or in addition, the texturing of the laminating rolls can also be configured such that, for example, protrusions on the roll surface engage in the grooves between the ridges and enclose the ridges and hold them in position and in an advantageous manner prolong the service life of the device.

Overall, the quality of the ferroelectret multi-layer composite produced can be further improved by means of the texturing of the laminating roll.

If at least the ridges of the mask are formed from metallic and magnetic material, it can also be provided according to the invention that the laminating unit has magnetic elements above and below the ridges. Advantageously, the ridges can be held in the desired position by this measure. This contributes to the dimensional stability and durability of the mask. As a result, the quality of the ferroelectret multi-layer composite products produced can be increased and maintained and guaranteed over a prolonged period.

The invention is explained below by way of example in conjunction with the figures, without being limited to these embodiments.

These show the following.

Figure 1:
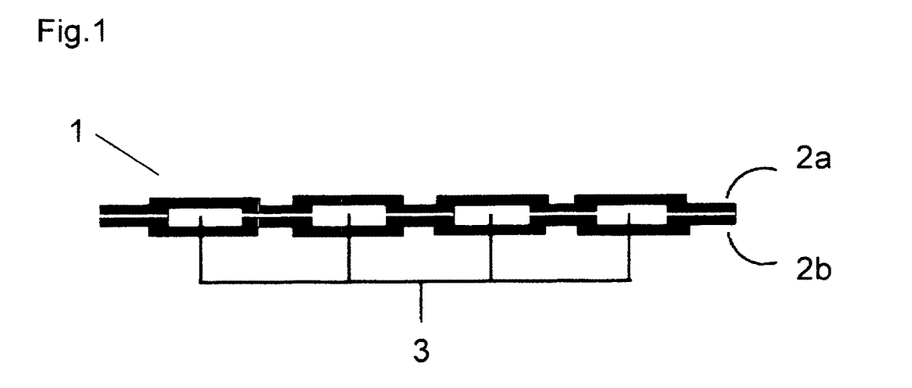
FIG. 1: a diagrammatic view of a ferroelectret multi-layer composite according to the invention consisting of two polymer films in cross section.

FIG. 1 shows a diagrammatic view of a ferroelectret multi-layer composite 1 according to the invention consisting of two polymer films 2a, 2b in cross section. Between the polymer films 2a, 2b, a ply of tubular channels 3 arranged parallel to one another is formed. The channels 3 have a rectangular cross section. Advantageously, this cross section shape is particularly simple to produce. The polymer films 2a, 2b are bonded together between the channels and are only shown separately for illustrative purposes.

Figure 2:
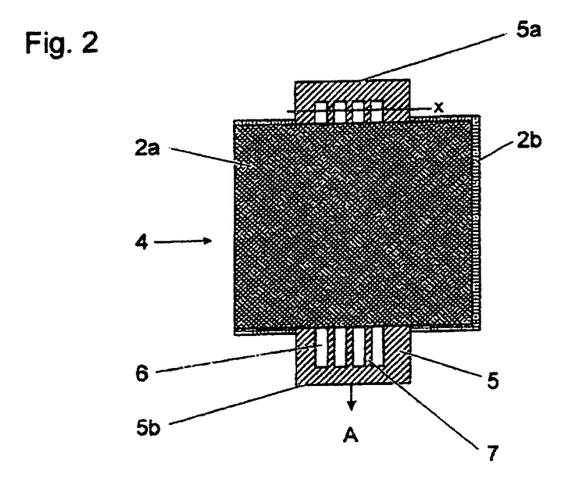
FIG. 2: a top view of a stack of layers according to the invention consisting of two polymer films with a mask layer.

FIG. 2 shows a top view of a stack of layers 4 according to the invention consisting of two polymer films 2a, 2b with a mask layer 5 and also illustrates a simple way of producing the ferroelectret multi-layer composite 1 shown in FIG. 1. The mask layer 5 can be a polymer film sheet, e.g. of polytetrafluoroethylene (PTFE), into which parallel, elongated, rectangular grooves 6 are cut or stamped so that the ridges 7 are formed as parallel film strips which are joined together at both ends 5a, 5b of the polymer mask film 5. This has the advantage that the ridges 7 are fixed at both ends 5a, 5b of the mask 5 and do not slip or become deformed, particularly during manual handling and while carrying out the process. The ends 5a, 5b of the mask film 5 protrude from the stack of layers 4 that is formed. The stack of layers 4 can then be laminated at a suitable elevated temperature. During this operation, the polymer films 2a, 2b bond together in the grooves 6 of the mask 5 and outline the shape of the ridges 7. At one end 5a, the ridges can then be separated from one another along the dotted line X, e.g. by simply cutting off. This results in the mask 5 obtaining a comb-like shape, enabling it to be readily pulled out of the polymer film composite in the direction of the arrow A and removed. A polymer film composite 1 is obtained consisting of two polymer films 2a, 2b with parallel tubular channels 3, which extend continuously from one side of the polymer film composite to the opposite side of the polymer film composite.

Figure 3A:
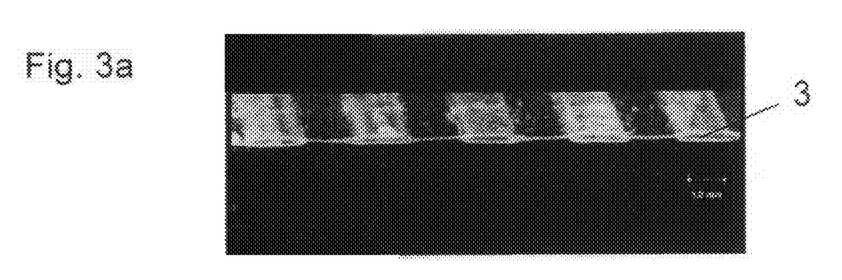
FIG. 3a: a picture of a ferroelectret multi-layer composite of two polycarbonate films produced according to the invention in top view.

FIG. 3a shows a picture of a ferroelectret multi-layer composite 1 produced analogously to the process described in the description relating to FIG. 2 from two polycarbonate films with five parallel tubular channels 3 that have been formed, taken with a stereo light microscope.

Figure 3B:
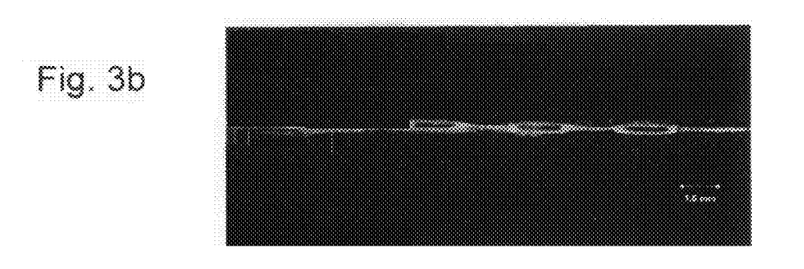
FIG. 3b: a picture of a ferroelectret multi-layer composite of two polycarbonate films produced according to the invention in cross section.

FIG. 3b shows a picture, taken with a stereo light microscope, of a ferroelectret multi-layer composite 1 also produced according to the description relating to FIG. 2 from two polycarbonate films with four parallel tubular channels 3.

Figure 4:
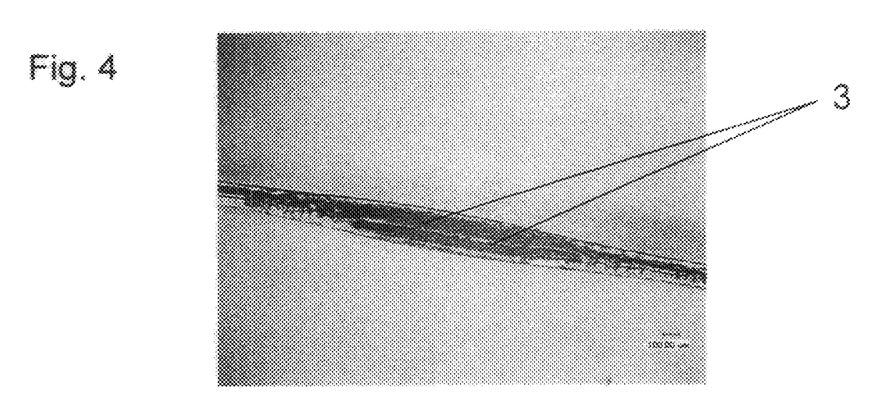
FIG. 4: a picture of a section of a ferroelectret multi-layer composite of three polycarbonate films produced according to the invention in cross section

FIG. 4 shows a light microscope picture of a section of a ferroelectret multi-layer composite 1 produced according to the invention from three polycarbonate films in cross section. The section shows two channels 3 arranged parallel to one another in consecutive plies. The channels 3 shown in the consecutive plies are oriented parallel to one another and arranged with a slight offset in relation to one another.

Figure 5:
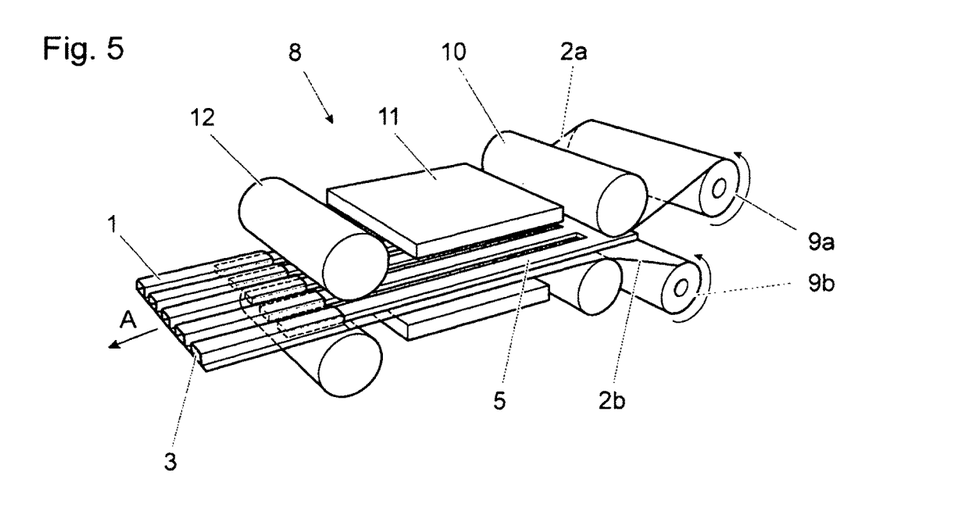
FIG. 5: a diagrammatic representation of a device for carrying out the process according to the invention.

FIG. 5 shows a diagrammatic representation of a device 8 for carrying out steps a), b) and d) of the process according to the invention in a roll-to-roll process. As feed devices, a first and a second feed roll 9a, 9b are used for the continuous feed of at least one polymer film 2a above and at least one polymer film 2b below the mask 5 to form a stack of layers 4. The terms "upper" and "lower" and "above" and "below" each refer only to the plies in relation to one another and are optionally interchangeable. The ridges of the mask 5 are joined together at the end facing the feed rolls 9a, 9b and are separated from one another at the opposite end. In principle, other orientations of the mask are conceivable, e.g. an arrangement at a right angle to the direction of production. In addition, the device 8 shown contains a laminating unit which is formed from first laminating rolls 10, a heating device 11 and second laminating rolls 12 above and below the mask 5 in the direction of production in each case. In the laminating unit, the polymer films 2a, 2b are pressed together in the grooves 6 of the mask 5 and bonded together to form the channels 3. The polymer composite 1 that is formed with tubular channels 3 can then be drawn continuously in the direction of the arrow A and transported away. In this way, a multi-layer composite can be obtained with, as it were, infinitely long channels 3. The dimensions and the spacing of the channels can be determined by an appropriate design of the mask 5. It is an enormous advantage that the process being put forward is independent of material within broad ranges and this permits a broad range of applications. Advantageously, using the device according to the invention, the process can be carried out at least partly as a continuous process, even on a large scale, as a roll-to-roll process, it being advantageously possible, in principle, to carry out all the process steps, i.e. including the polarisation of the internal channel surfaces, continuously and/or automatically. This is particularly advantageous for implementing the process on an industrial scale. The automation of at least part of the production process simplifies the process and makes possible the inexpensive production of a ferroelectret multi-layer composite with parallel tubular channels 3.

In summary, according to the invention a process for the production of a ferroelectret multi-layer composite with tubular channels is provided, which can be carried out simply and inexpensively even on a large scale. The ferroelectret multi-layer constructions produced by the process according to the invention can also be made with a greater number of layers with a precisely defined void structure. The variable adjustability of the cross sectional geometry and the dimensions, the number of tubular channels produced according to the invention, the sequence of layers and number of plies of the tubular channels and the wide choice of materials for the polymer films used enable the ferroelectrets produced according to the invention to be adapted particularly well to appropriate areas of application.

The examples given below are intended to explain the invention further, without its being restricted thereto.

EXAMPLES

Example 1

Production of a Ferroelectret Multi-Layer Composite from Polycarbonate Films

Between two polymer film sheets of polycarbonate, a polymer film sheet of PTFE was inserted as a mask. The polycarbonate films each had a thickness of 50 µm. Elongated rectangular grooves running parallel to one another were cut into the mask in such a way that the ridges took the form of parallel film strips with a width of 1.3 mm, which were joined together at both ends of the mask. The ends of the mask protruded out of the stack of layers that was formed. The mask film had a thickness of 200 µm. The stack of layers was then laminated at a temperature of 180° C. During this operation the polycarbonate films bonded together in the area of the grooves in the mask and outlined the shape of the ridges. At one end, the ridges were separated from one another by simply cutting off the end of the mask film. This resulted in the mask obtaining a comb-like shape, enabling it to be readily removed from the polycarbonate film composite by pulling on the other end, where the ridges were still joined. A polymer film composite was obtained consisting of two polycarbonate films with continuous parallel tubular channels. The width and height of the channels was defined by the width and height of the ridges. The height of the channels was 200 µm. The polycarbonate films were then provided on their outward-facing surfaces with 50 nm thick aluminium electrodes and polarised by means of a directly applied electric current of 3 kV.

The piezoelectric d33 coefficient was measured after 2 weeks.
d33 polycarbonate sample 1: 350 pC/N
d33 polycarbonate sample 2: 600 pC/N Example 2

Production of a Ferroelectret Multi-Layer Composite from FEP Films

The production of the ferroelectret multi-layer composite was carried out as in Example 1 with FEP films having a thickness of 50 µm and a mask of PTFE having a thickness of 200 µm and ridge widths of 1.3 mm. The bonding of the FEP films by lamination took place at a temperature of 300° C. The piezoelectric d33 coefficient was measured after 2 weeks.

In a similar way, other ferroelectret multi-layer composite samples were produced from 50 µm thick FEP films and with PTFE mask layers having thicknesses of 25 µm, 50 µm, 100 µm, 200 µm and 300 µm. In each case, 10 samples were made for each mask layer thickness used. These polymer film pieces were 4 cm×4 cm to 10 cm×13 cm in size. Each sample was measured 5 times after 2 weeks according to the procedure in Example 3. A mean and a standard deviation were then determined from all the values, and are reproduced in Table 1 below.

TABLE 1

| Channel height [µm] | d33 mean value [pC/N] | d33 standard deviation [pC/N (±)] |
|---|---|---|
| 25 | 27.4 | 6.4 |
| 50 | 79.4 | 9.13 |
| 70 | 55.8 | 13.14 |
| 100 | 107.6 | 35.84 |
| 200 | 56.2 | 13.96 |
| 300 | 43.1 | 15.43 |

Example 3

Test Set-Up for the Mechanical Measurement of the d33 Piezoelectric Constants and Performing the Measurements For the test device, in principle the following three main components are required: force generator, force measuring instrument and charge measuring instrument. A type 4810 electric shaker from Brüel & Kjær was selected as the force generator. The shaker makes it possible to exert a defined force as a function of the input voltage. This shaker was mounted on a movable platform, the position of which is manually adjustable in the vertical direction. The height adjustability of the shaker is necessary for clamping the samples. In addition, the static pre-pressure needed for the measurement can be adjusted therewith. To control the shaker, a DS345 function generator from Stanford Research Systems was used in conjunction with a type 2718 power amplifier from Brüel & Kjær. A type 8435 force sensor from Burster was used as the force measuring instrument. The force sensor is designed for both pressure and tensile load measurements in the range of from 0 to 200 N. However, the force must only be applied vertically so no lateral force components or torques act on the sensor. In order to ensure this, the force sensor was provided with a cylindrical pressure guide runner with a stainless steel pin sliding therein almost without friction. At the free end of the pin, there was a two centimeter wide polished plate which acted as a supporting surface for the samples. The signals from the force sensor are detected with a type 9243 amplifier module from Burster and transmitted to a GOULD 4094 oscilloscope.

As the charge measuring instrument, a type 2635 charge amplifier from Brüel & Kjær was used. The charge amplifier enables charges of up to 0.1 pC to be detected. To measure the surface charge, both sides of the sample must be electrically connected to the charge amplifier. The electrical contact to the lower side of the sample is made possible by the supporting surface, which in turn is connected to the overall set-up. The upper side of the sample was connected to the charge amplifier by the pressure-exerting stamp made of brass. The stamp is electrically insulated from the rest of the set-up by means of a Plexiglas top on the shaker and is connected to the charge amplifier by a cable.

The cable should be as thin and flexible as possible to avoid mechanical stresses and thus falsifications of the test results. The measured signal is finally transmitted from the charge amplifier to the oscilloscope.

A pre-pressure of 3 N (static) was set as standard and measurements were made with an amplitude of 1 N (dynamic).

The invention claimed is:

1. A ferroelectret multi-layer composite comprising at least two polymer films arranged one on top of the other and bonded together, wherein voids are formed between the polymer films, characterised in that the voids are tubular channels.

2. The ferroelectret multi-layer composite according to claim 1, characterised in that the voids are tubular channels running parallel to one another.

3. The ferroelectret multi-layer composite according to claim 1, characterised in that the polymer films consist of identical or different polymer materials selected from the group of the polycarbonates, fluorinated polymers and copolymers, polyesters, polyimides, polymethyl methacrylate, cyclo-olefin polymers, cyclo-olefin copolymers and polypropylene.

4. The ferroelectret multi-layer composite according to claim 1, characterised in that three or more polymer films are arranged one on top of the other and bonded together, and the tubular channels between the polymer films are arranged parallel or perpendicular to one another in plies arranged one on top of the other.

5. The ferroelectret multi-layer composite according to claim 1, characterised in that the channels (3) are open at their ends or closed at one or both ends.

6. The ferroelectret multi-layer composite according to claim 1, characterised in that a conductive coating is at least partially applied to the outward-facing surfaces of the polymer films.

7. A piezoelectric element containing a ferroelectret multi-layer composite according to one of claims 1 to 6.

8. The piezoelectric element according to claim 7, characterised in that it is a sensor or actuator element.

9. A device or the production of a ferroelectret multi-layer composite according to claim 1, characterised in that it comprises means of forming tubular channels.

* * * * *

UNITED STATES PATENT AND TRADEMARK OFFICE
CERTIFICATE OF CORRECTION

| | | |
|---|---|---|
| PATENT NO. | : 8,446,080 B2 | |
| APPLICATION NO. | : 12/998839 | |
| DATED | : May 21, 2013 | |
| INVENTOR(S) | : Werner Jenninger et al. | |

It is certified that error appears in the above-identified patent and that said Letters Patent is hereby corrected as shown below:

On title page, item 54 and in the specification, column 1, lines 1-5, title, replace "FERROELETRET MULTILAYER COMPOSITE AND METHOD FOR PRODUCING A FERROELECTRET MULTILAYER COMPOSITE WITH PARALLEL TUBULAR CHANNELS" with "."

FERROELECTRET MULTILAYER COMPOSITE AND METHOD FOR PRODUCING A FERROELECTRET MULTILAYER COMPOSITE WITH PARALLEL TUBULAR CHANNELS

Signed and Sealed this
Twenty-third Day of July, 2013

Teresa Stanek Rea
*Acting Director of the United States Patent and Trademark Office*